United States Patent [19]
Gösele

[11] Patent Number: 5,985,412
[45] Date of Patent: Nov. 16, 1999

[54] METHOD OF MANUFACTURING MICROSTRUCTURES AND ALSO MICROSTRUCTURE

[75] Inventor: Ulrich Gösele, Halle, Germany

[73] Assignee: Max-Planck-Gesellschaft zur Foerderung der Wissenschaften e.V., Munich, Germany

[21] Appl. No.: 08/974,897

[22] Filed: Nov. 20, 1997

[30] Foreign Application Priority Data

Nov. 25, 1996 [DE] Germany .......................... 196 48 759

[51] Int. Cl.$^6$ ................. B32B 3/00; B32B 31/00
[52] U.S. Cl. .................. 428/172; 428/178; 437/901; 437/974; 156/281; 156/306.3
[58] Field of Search .................. 428/188, 178, 428/137, 172, 213, 428, 446; 437/245, 225, 241, 901, 974; 156/281, 290, 306.3; 228/116; 148/DIG. 12, DIG. 135

[56] References Cited

U.S. PATENT DOCUMENTS 4,962,879 10/1990 Goesele .................................. 228/116
5,169,472 12/1992 Goebel .................................... 156/281

FOREIGN PATENT DOCUMENTS 40 09 090 C2  4/1992  Germany .

OTHER PUBLICATIONS

Gösele, U., et al.: "Self–propagating room–temperature silicon wafer bonding in ultrahigh vacuum", *Appl. Phys. Lett.* 67(24), Dec. 11, 1995, pp. 3614–3616.

Takagi, H., et al.: "Surface activated bonding of silicone wafers at room temperature", *Appl. Phys. Lett.* 68(16), Apr. 15, 1996, pp. 2222–2224.

Mack, S., et al.: "Gas Development at the interface of directly bonded silicon wafers: investigation on silicon–based pressure sensors", *Sensors and Actuators* A 56 (1996) 273–277.

Mack, S., et al., "Analysis of the bonding related gas enclosure in micromachined cavities sealed by silicon wafer bonding", submitted to J. Electrochem. Soc.

Swartz, C.S., et al.: "Silicon pressure transducer technology for automotive applications", (Motorola Semiconductor Group, Arizona, USA).

Gösele, U., et al.: "History and Future of Semiconductor Wafer Bonding", *Solid State Phenomena* 47 and 48 (1995) pp. 34–44.

*Primary Examiner*—Donald Loney
*Attorney, Agent, or Firm*—Townsend and Townsend and Crew LLP

[57] ABSTRACT

A method of manufacturing microstructures in which a hollow cavity is formed in a first wafer, in particular, a silicon wafer, and the hollow cavity is, covered over by a second wafer, which is in particular, also a silicon wafer, by a wafer bonding process in vacuum for the formation of an enclosed hollow cavity, wherein the wafer bonding is carried out in an ultra-high vacuum in order to achieve the smallest possible internal pressure in the hollow cavity of less than 0.1 mbar. The surfaces of the wafers which are to be brought into contact with one another are treated by a surface cleaning process in order to produce at least substantially pure surfaces, i.e. surfaces which consist substantially only of the material of the respective wafer and which are at least substantially free of $H_2O$, $H_2$ and $O_2$. A microstructure is also claimed.

11 Claims, 1 Drawing Sheet

METHOD OF MANUFACTURING MICROSTRUCTURES AND ALSO MICROSTRUCTURE

FIELD OF THE INVENTION

The present invention relates to a method of manufacturing microstructures in which a hollow cavity is formed in a first wafer, in particular in a silicon wafer, and this is covered with a second wafer, likewise in particular a silicon wafer, by a wafer bonding process in vacuum to form an enclosed hollow cavity. Furthermore, the invention relates to a microstructure, in particular a microstructure manufactured in accordance with a method of this kind.

DESCRIPTION OF THE PRIOR ART

In the field of so-called micromechanics many components are known which include closed hollow cavities in which structures are optionally present. For example, pressure sensors are known in which a relatively thin membrane of silicon bounds the one side of a hollow cavity formed in a silicon wafer, with the bending deflection of the silicon membrane being determined by means of suitable sensors, for example, by resistors produced on the surface of the membrane by means of suitable doping and being used for pressure measurement. Furthermore, acceleration sensors are known in which finger structures in the hollow cavities are deformed depending on the extent of the acceleration and can be used with corresponding sensors for the determination of the acceleration.

It is important in the field of micromechanics that the structures are produced in semiconductor materials, partly using insulating wafers, because the semiconductor materials can be exploited through corresponding design and doping for the required electronic evaluation of the mechanical processes.

In many structures, it is important to produce the smallest possible internal pressure in the respective hollow cavities. By way of example, with a pressure sensor, the smallest possible internal pressure is aimed at in order to produce an absolute pressure sensor. In other components, the precise frequency of oscillation is important and this depends on the internal pressure of the hollow cavity.

For the production of absolute pressure sensors in the field of silicon micro/mechanics, hollow cavities have previously been etched into a silicon wafer which was then closed off by a second silicon wafer or glass wafer under high vacuum conditions by means of the currently known wafer bonding technologies, for example, anodic bonding or direct wafer bonding. In each case, an annealing step is necessary at elevated temperatures which are normally higher than 200° C.

In the case of anodic bonding, a voltage is applied during the bonding process which leads to a current. This in turn has the consequence of a chemical reaction in which oxygen is set free which causes a rise in the internal pressure in the hollow cavities. In the case of direct wafer bonding, hydrogen is set free at the boundary surface during the annealing step independently of whether one is operating with hydrophilic or hydrophobic surfaces. This takes place either through the desorption of hydrogen at hydrophobic boundary surfaces, or by the reaction of water and silicon in accordance with the equation:

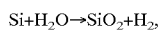

$$Si + H_2O \rightarrow SiO_2 + H_2,$$

with the hydrogen diffusing to the hollow cavities and increasing their internal pressure.

OBJECT OF THE INVENTION

The object of the invention is to provide a method and also a microstructure with which it is possible to generate closed off hollow cavities in semiconductor wafers, in particular in silicon wafers, which have, following manufacture, a very low internal pressure, i.e. a high vacuum, and simultaneously to achieve a high strength bond between the wafers defining the respective hollow cavities.

BRIEF DESCRIPTION OF THE INVENTION

In order to satisfy this object, provision is made methodwise that, in order to achieve the smallest possible internal pressure in the hollow cavity of less than 0.1 mbar, the wafer bonding is carried out in ultra-high vacuum after the surfaces of the wafers, which are to be brought into contact with one another, have been treated by a surface cleaning process in order to generate at least substantially clean surfaces, i.e. surfaces which consist substantially only of the material of the respective wafer and, in particular, surfaces which are at least substantially free of $H_2O$, $H_2$ and $O_2$.

In this respect, the surface cleaning of the surfaces of the wafers which are to be brought into contact with one another is carried out in a vacuum chamber prior to carrying out the bonding, both for hydrophobic wafers and also for hydrophilic wafers, by a thermal treatment at a suitable temperature in order to free the wafer surfaces of $H_2O$, $H_2$ and $O_2$, with the thermal treatment of the hydrophobic wafers bringing about the desorption of the hydrogen and, with hydrophilic wafers, the vaporization of the absorbed water and the dissociation of the natural $SiO_2$ and the vaporization of the SiO which arises. The thermal treatment is preferably carried out at a temperature in the range from 600° C. to 800° C. Alternatively, the surface cleaning of the surfaces of the wafers which are to be brought into contact with one another takes place in a vacuum chamber prior to carrying out the bonding by sputtering or by a plasma treatment with inert gases. That is to say, the cleaning is carried out by a sputtering treatment or a plasma treatment with inert gases (i.e. sputter etching, plasma etching and/or ion etching).

During the thermal treatment, which is preferably carried out at a temperature in the range of 600° C. to 800° C., both wafers with hydrophobic surfaces and also wafers with hydrophilic surfaces can be treated. In the treatment of wafers with hydrophobic surfaces the hydrogen of the $H_2$ layer is desorbed by the thermal pre-treatment. The $H_2$ layer passes in this manner into the atmosphere of the vacuum chamber and is largely extracted. by the vacuum system In the treatment of hydrophilic surfaces, the adsorbed water is first evaporated, the remaining $SiO_2$ surface is then dissociated to SiO and $O_2$ and the SiO which arises is subsequently vaporized.

It has namely been found, in accordance with the invention, that the gas atmosphere within closed hollow cavities in micromechanical structures consists largely of $H_2O$, $H_2$ and $O_2$, however, also partly of other gases, such as $N_2$ and $CH_4$.

It is possible to keep the proportion of $CH_4$ small by corresponding process control, in particular, cleanliness of the wafers. The proportion of $N_2$ is not easy to explain. It is however assumed that the $N_2$ gases which have been found arise from $NO_x$ radicals on the wafer surface, with these radicals arising after hydrophilization in concentrated $HNO_3$.

It has furthermore been determined, in accordance with the invention, that the gas content of the hollow cavities originates in large part from the surrounding boundary surface, i.e. from the regions around the hollow cavity, where the wafer surfaces are directly bonded together, and indeed as a result of diffusion processes which are favored by annealing steps. It can take a relatively long time before these diffusion processes have been concluded and equilibrium conditions prevail within the hollow cavities Furthermore, in accordance with the invention, it has been recognized that by removing $H_2O$, $H_2$ and $O_2$ molecules from the surfaces of the semiconductor elements which are to be brought into contact with one another by means of a suitable surface cleaning process, any possibly present $CH_4$ and $N_2$ radicals can also be removed and no longer diffuse into the hollow cavities. As a result, after the conclusion of the bonding process, a very low pressure level prevails within the hollow cavities and this internal pressure also no longer increases in the course of time, because the diffusion along the boundary surfaces no longer arises as a result of the covalent bond between the two wafers which prevails there.

The wafer bonding in the ultra-high vacuum can either take place at elevated temperature, such as for example 600° C., or at room temperature, or at lower temperatures.

It is particularly favorable that, as a result of the very clean surfaces, the bonding process can also be carried out straightforwardly at room temperature and lead to a covalent bond which represents a high strength bond between the two wafers. Since an annealing step is no longer required in order to achieve a covalent bond, any contaminants, which may eventually still be present, such as $H_2O$, $H_2$, $O_2$, $CH_4$ and $N_2$ remain trapped at the boundary surface and do not diffuse into the hollow cavities to a pronounced degree. Accordingly, they can also not lead to an increased internal pressure there.

Furthermore, the method of the invention can in many cases be carried out in such a way that doped layers and structures which have been created in the semiconductor wafers, do not deteriorate or do not deteriorate to a significant degree through the temperatures which prevail during the bonding process, for example, as a result of diffusion. By way of example, it is possible, on carrying out the surface cleaning by means of sputtering or with a plasma treatment, to carry out this type of treatment at a temperature which is relatively low, whereby the undesired diffusion does not arise to a significant degree during the period of the treatment. The duration of a thermal treatment of the surfaces for the purpose of surface cleaning can also be kept relatively short, so that the diffusion which arises here can also be restricted. A restriction of this kind is not possible with the customarily present heat treatment, i e. the normally present annealing step, because this treatment or step, which is not necessary with the invention, lasts possibly for several hours in the prior art, and then leads to extensive diffusion processes.

Through using the invention, one succeeds in manufacturing microstructures in which the internal pressure in the hollow cavities lies at least substantially at the same pressure level which prevails inside the vacuum chamber during the vacuum treatment. Thus, it proves possible in any event to avoid internal pressures which are higher than 0.1 mbar. Internal pressures which are smaller than 0.01 mbar are preferably achieved.

It is admittedly known from the article "Surface Activated Bonding of Silicon Wafers at Room Temperature", H. Tagaki, K. Mikuchi, R. Meida, T. R. Chung and T. Tsuga in Applied Physics Letters 68, 16 of Apr. 15, 1996, pages 2222 and 2223, to bond surfaces activated by sputter etching or ion beam etching to one another at room temperature and thereby to obtain bond strengths which are approximately 10 times higher than with wet bonded surfaces. In this connection, the bonding process was carried out in a vacuum chamber at $2\times10^{-6}$ Pa. This work was not, however, concerned with wafers which have hollow cavities and could therefore not provide any suggestion in the direction of the present invention.

DESCRIPTION OF THE PREFERRED EMBODIMENT

Figure 1:
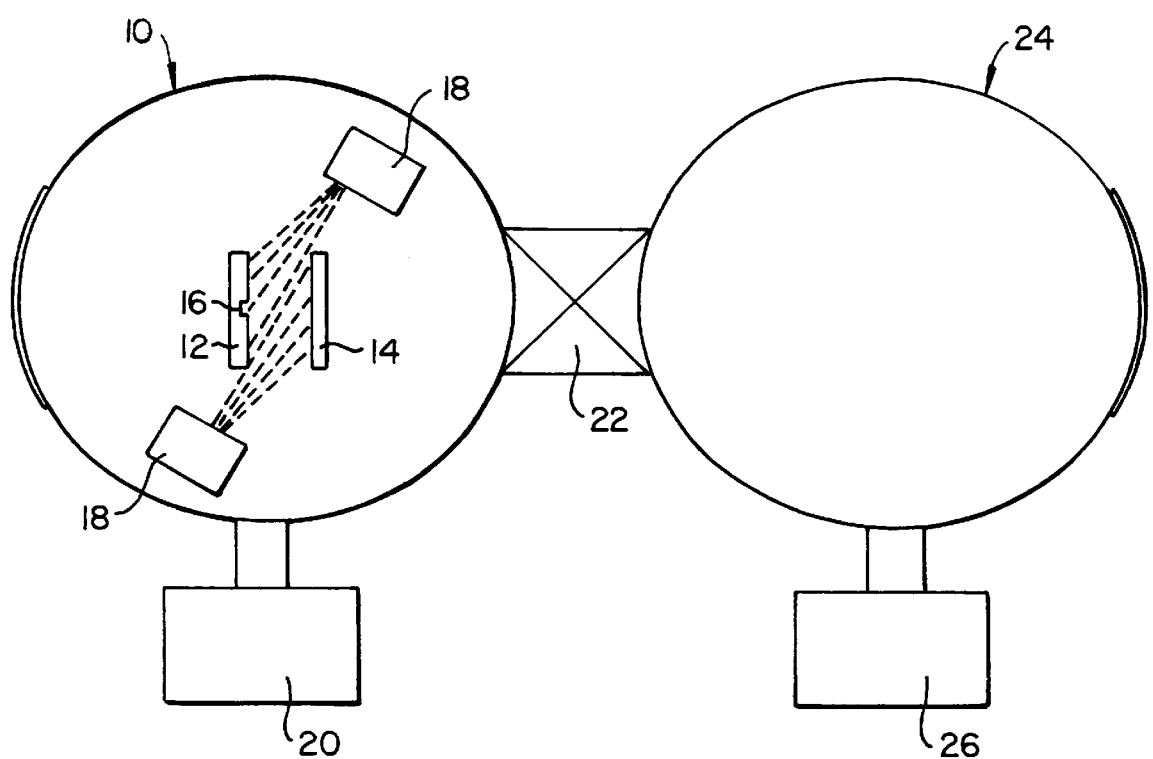
FIG. 1 is a schematic representation of a vacuum treatment plant.

The reference numeral 10 designates a first vacuum chamber in which two silicon wafers 12, 14 are located, which are to be bonded to one another. A recess 16 formed by lithography and etching is present in the silicon wafer 12. This recess will be closed off by the second wafer 14 after carrying out the bonding process and thus form a closed hollow cavity.

At this point, it should be noted that it is very improbable that only a single hollow cavity is present. In place of this, a plurality of like structures will normally be produced on one wafer and each micromechanical structure can have a plurality of hollow cavities. Moreover, it is frequently not just two wafers, but rather a plurality of wafers each having structures produced by lithography and etching which will be bonded to one another, so that a plurality of hollow cavities, partly with integrated structures or circuits arise in the finished structure. The present example is only being described with respect to two wafers in order to explain the principle.

Prior to introducing them into the vacuum chamber, the two wafers are cleaned, with the cleaning preferably being carried out in accordance with the principle explained in the U.S. Pat. No. 4,962,879 so that, in any event, hydrophilic or hydrophobic surfaces are present. The pre-cleaning in the apparatus in accordance with U.S. Pat. No. 4,962,879 can take place both in a clean room and also in a laboratory because it has been found that after cleaning in the apparatus of U.S. Pat. No. 4,962,879 the wafers are not contaminated, at least with a short stay outside of a clean room, when a small gap is maintained between the wafers. This is apparently because no air movements can take place between the surfaces, which could lead to contamination, because of the small width of the gap.

After introducing the wafers into the vacuum chamber 10, the surfaces of the wafers 12, 14, which have a spacing from one another, are subjected to a plasma treatment by the plasma generating device 18 built into the chamber, and with a plasma etching process, whereby the confronting surfaces of the wafers are cleaned by bombardment with the ions of an inert gas, for example Argon.

The $H_2O$, $H_2$ and $O_2$ molecules liberated by the etching process are transferred in the vacuum chamber into the gas phase and are removed from the vacuum chamber by the vacuum system 20. This also applies to any contamination which may eventually be present. After the cleaning process, which can, for example, last for about 5 minutes, the surfaces of the two wafers consist at least substantially only of the respective material of the wafers. The two wafers are then simply pressed together, and at a temperature which corresponds to room temperature or possibly lies slightly above it or below it. As a rule, temperatures above 200° C. are consciously avoided. It is, however, possible to carry out the wafer bonding process proposed here in the ultra-high vacuum at elevated temperatures up to ca. 500° C. For certain applications, this is simpler to carry out and can lead to the same result.

Through the contact of the surfaces at one point, the two surfaces are bonded together by the formation of covalent bonds over the entire boundary surface, and in this manner, the desired micromechanical structure or structures anse with enclosed hollow cavities in which a very low internal pressure prevails, corresponding to that of the chamber. Even after removing the structures from the vacuum chamber and with long exposure to the outside environment, the internal pressure corresponds at least substantially to the vacuum pressure in the vacuum chamber 10.

After formation of the structure, the two bonded together wafers can optionally be moved through a vacuum lock 22 into a second vacuum chamber 24 with its own vacuum system 26 and here treated further by known techniques of semiconductor manufacture for the purpose of the attachment of electrodes or production of electronic structures. It is, however, also possible to provide the wafers which are to be brought together with such structures in advance, i.e. before the cleaning step in the apparatus of U.S. Pat. No. 4,962,879, or prior to the introduction into the vacuum chamber 10 in a clean room, in so far as the apparatus in accordance with U.S. Pat. No. 4,962,879 is not used.

It should be noted that the invention is not restricted in its use with silicon semiconductors, but can rather be used in general for the bonding of semiconductor wafers. It is also possible to use insulating glass wafers, providing the surfaces of these glass wafers, which customarily consist in a large part of silicon, are cleaned in the vacuum chamber 10 in the described way and manner.

It is also possible, instead of using an etching process, to subject the wafers 12 and 14 to a thermal treatment in the chamber 10. For this purpose, the devices 18 are then to be formed as heating devices, for example as infrared heaters.

We claim:

1. A microstructure, comprising at least a first and a second wafer which are bonded together, wherein at least one hollow cavity is present in at least one of the wafers and is covered over by the other wafer for formation of a closed hollow cavity
   wherein an inner pressure of less that 0.1 mbar prevails in the hollow cavity, and
   wherein surfaces of the wafers that are bonded together are substantially clean surfaces that consist essentially only of the material of the respective wafer and are substantially free of $H_2O$, $H_2$ and $O_2$.

2. A microstructure in accordance with claim 1 wherein the first and second wafers are silicon wafers.

3. A microstructure in accordance with claim 1 wherein an inner pressure of less than 0.01 mbar prevails in the hollow cavity.

4. A method of manufacturing microstructures in which a hollow cavity is formed in a silicon wafer and is covered with a second wafer by a wafer bonding process in vacuum to form an enclosed hollow cavity, wherein surfaces of the wafers that are to be brought into contact with one another are treated by a surface cleaning process in order to produce substantially clean surfaces that consist essentially only of the material of the respective wafer and that are substantially free of $H_2O$, $H_2$ and $O_2$, and wherein the wafer bonding is carried out in ultra-high vacuum for the purpose of achieving the smallest possible inner pressure in the hollow cavity of less than 0.1 mbar.

5. A method of manufacturing microstructures in accordance with claim 4 wherein the second wafer is a silicon wafer.

6. A method of manufacturing microstructures in which a hollow cavity is formed in a first wafer that is covered with a second wafer by a wafer bonding process in vacuum to form an enclosed hollow cavity,
   wherein surfaces of the wafers that are to be brought into contact with one another are treated by a surface cleaning process in order to produce substantially clean surfaces that consist essentially only of the material of the respective wafer and that are substantially free of $H_2O$, $H_2$ and $O_2$, and
   wherein the wafer bonding is carried out in ultra-high vacuum for the purpose of achieving the smallest possible inner pressure in the hollow cavity of less than 0.1 mbar.

7. A method in accordance with claim 6, wherein the wafer bonding is carried out in the ultra-high vacuum at room temperature, or at a lower temperature with a subsequent thermal treatment (annealing step) either not being carried out or only being carried out at temperatures less that 200° C.

8. A method in accordance with claim 6, wherein the surface cleaning of the surfaces of the wafers which are to be brought into contact with one another is carried out in a vacuum chamber prior to carrying out the bonding, both for hydrophobic wafers and also for hydrophilic wafers, by a thermal treatment at a suitable temperature in order to free the wafer surfaces of $H_2O$, $H_2$ and $O_2$, with the thermal treatment of the hydrophobic wafers bringing about the desorption of the hydrogen and, with hydrophilic wafers, the vaporization of the absorbed water and the dissociation of the natural $SiO_2$ and the vaporization of the SiO which arises.

9. A method in accordance with claim 8 wherein the thermal treatment is carried out at a temperature in the range from 600° C. to 800° C.

10. A method in accordance with claim 6, wherein the surface cleaning of the surfaces of the wafers which are to be brought into contact with one another takes place in a vacuum chamber prior to carrying out the bonding by sputtering or by a plasma treatment with inert gases.

11. A method in accordance with claim. 6, wherein the wafers which are cleaned in a vacuum chamber are either bonded to one another in the same vacuum chamber or after transfer into a further vacuum chamber without the cleaned wafers being exposed in the intervening period to a reactive atmosphere, with the wafers not being exposed in the intervening period to any significantly elevated environmental pressure.

* * * * *